United States Patent [19]

Ramaswamy et al.

[11] Patent Number: 5,740,203
[45] Date of Patent: Apr. 14, 1998

[54] TRELLIS DEMAPPER OF A CONVOLUTIONAL DECODER FOR DECODING PRAGMATIC TRELLIS CODES SUITABLE FOR USE IN A MULTI-CHANNEL RECEIVER OF SATELLITE, TERRESTRIAL AND CABLE TRANSMITTED FEC COMPRESSED-DIGITAL TELEVISION DATA

[75] Inventors: Kumar Ramaswamy; John Sidney Stewart, both of Indianapolis, Ind.

[73] Assignee: Thomson Consumer Electronics, Inc., Indianapolis, Ind.

[21] Appl. No.: 528,370

[22] Filed: Sep. 14, 1995

[51] Int. Cl.$^6$ ................................................. H03M 13/12
[52] U.S. Cl. .......................... 375/341; 371/43.1; 371/43.4
[58] Field of Search .................................. 375/341, 262, 375/340, 329; 371/43.1, 37.8, 43.4, 43.8, 43.7; 348/726

[56] References Cited

U.S. PATENT DOCUMENTS 5,469,452  11/1995  Zehavi ........................................ 371/43

OTHER PUBLICATIONS

Preliminary Data Bulletin for the Q1875 Trellis Decoder, Qualcomm Incorporated, VLSI Products Division, San Diego, CA.

Development of Variable Rate Viterbi Decoder and its Performance Characteristics, Proceedings of the 6th ICDSC Conference, Phoenix, Arizona, 1983.

A 25 MHz Viterbi FEC Codec by Kerr et al., IEEE 1990 Custom Integrated Circuits Conference.

Practical Coding for QAM Transmission of HDTV by Heegard et al., IEEE Journal on Selected Areas in Communications, Jan. 1993.

Forward Error Correction Applied to Intelsat IDR Carriers by Morley, International Journal of Satellite Communications, vol. 6, 1988.

45 Mbps Viterbi Decoder, STEL–2060, Stanford Telecommunications, Sunnyvale, CA, 1992, 1993, pp. 1–15.

*Primary Examiner*—Temesghen Ghebretnsae
*Attorney, Agent, or Firm*—Joseph S. Tripoli; Eric P. Herrmann; Ronald H. Kurdyla

[57] ABSTRACT

A memory efficient trellis demapper for demapping 8-PSK and 16, 32, 64 128 and 256-QAM trellis codes contains respective I-channel, Q-channel and remapper random access memory (RAM), an 8-PSK demapper logic network, and a selector switch. Each RAM includes a lookup table selectively programmed for each QAM code. The I-channel RAM and the Q-channel RAM forward their respective outputs through the switch as the trellis demapper output in response to an even power of 2 (i.e., 16, 64 or 256) QAM trellis code being selected. In response to an odd power of 2 (i.e., 32, 128) QAM trellis code being selected, the respective outputs of the I and Q channel RAMs are input to the remapper RAM, and the remapper RAM output is conveyed via the switch as the trellis demapper output. When an 8-PSK trellis code is selected, the output of the 8-PSK demapper logic network is conveyed via the switch as the trellis demapper output.

19 Claims, 5 Drawing Sheets

TRELLIS DEMAPPER OF A CONVOLUTIONAL DECODER FOR DECODING PRAGMATIC TRELLIS CODES SUITABLE FOR USE IN A MULTI-CHANNEL RECEIVER OF SATELLITE, TERRESTRIAL AND CABLE TRANSMITTED FEC COMPRESSED-DIGITAL TELEVISION DATA

BACKGROUND OF THE INVENTION

This invention relates to digital processing apparatus suitable for use in a multi-channel receiver of satellite, terrestrial and cable transmitted forward-error-corrected (FEC) compressed-digital television data and, more particularly, to a trellis demapper for a Viterbi-algorithm based convolutional decoder capable of decoding pragmatic trellis codes.

Known in the art is the use of forward-error-correction that includes convolutional encoding in the transmission of encoded digital data over a noisy channel from a transmitter to a receiver that includes a branch metric computer for a Viterbi-algorithm based convolutional decoder. The Viterbi Algorithm is used very commonly to decode a convolutionally encoded sequence of bits transmitted over a noisy channel. In the heart of the Viterbi algorithm is a series of repetitive add-compare-select operations which accept as input certain metrics (termed branch metrics) computed on each received symbol from the demodulator. For satellite, cable and terrestrial transmission of high data rate signals, such computations need to performed at very high rates. Furthermore, in a modem/decoder operating over different channels with different (but related)-coding schemes, the cost of computing the branch metrics becomes excessive in terms of lookup table memory or actual hardware to perform these computations.

In the case of a satellite transmission channel, it is customary to transmit some particular punctured quaternary phase shift keyed (QPSK) code known to the receiver's convolutional decoder. In the case of a terrestrial or cable transmission channel, some particular pragmatic trellis code (such as quadrature amplitude modulation (QAM), phase amplitude modulation (PAM) or phase shift keyed (PSK) code) known to the receiver's convolutional decoder. For instance, the prior art discloses the use of a pragmatic trellis code as a practical code for QAM transmission of high definition television (HDTV).

Incorporated by reference herein is our copending U.S. patent application Ser. No. 08/342,280, (now U.S. Pat. No. 5,497,401) filed Nov. 11, 1994 and entitled "A Branch Metric Computer for a Viterbi Decoder of a Punctured and Pragmatic Trellis Code Convolutional Decoder Suitable for Use in a Multi-channel Receiver of Satellite, Terrestrial and Cable Transmitted FEC Compressed-Digital Television Data," which is assigned to the same assignee as the present application.

In the past, the receiver for a Viterbi-algorithm based convolutional decoder was typically designed to operate with only a single predetermined type of convolutional code. However, it is likely that multi-channel digital television receivers will enter the mass-produced market in the near future and, over time, replace currently-used analog television receivers. Direct broadcast satellite transmission to television receivers is already available in addition to terrestrial and cable transmission thereto. Therefore, it is desirable that the convolutional decoders of such multi-channel digital television receivers be selectively responsive to the type of code (either punctured or pragmatic trellis, as the case may be) and the type of modulation (PSK including both QPSK and 8-PSK, PAM or QAM, as the case may be) of the channel then being received by the multi-channel digital television receiver. Further, mass-produced television receivers should be designed with reduction in cost and complexity in mind.

The aforesaid copending U.S. patent application Ser. No. 08/342,280 is directed to a structure for the branch metric computer for the Viterbi decoder of the convolutional decoder which may be incorporated in such a multi-channel digital television receiver which is designed with reduction in cost and complexity in mind. First, the branch metric computer structure employs a RAM which is preloaded during an initialization phase with programmable, precomputed I and Q lookup tables from a microcontroller interface applied as a control input thereto. Second, this branch metric computer structure computes a one-dimensional measure of the distance between two points in the two-dimensional I,Q plane by substituting the sum of the I and Q components (I+Q) of the distance between the two points (the so-called "Manhattan" distance) for the Euclidean distance between the two points $(I^2+Q^2)^{1/2}$. This permits the I and Q components to be handled independently of one another, thereby reducing both the cost and complexity of the branch metric computer.

The convolutional decoder disclosed in the aforesaid copending U.S. patent application Ser. No. 08/342,280, under the control of the microcontroller interface, may be alternatively operated in either some particular punctured code mode (none of which utilizes a trellis demapper) or some particular pragmatic trellis code mode (all of which utilize a trellis demapper).

SUMMARY OF THE INVENTION

The present invention is directed to both the demapping techniques and structure of a trellis demapper for the type of convolutional decoder disclosed in the aforesaid copending U.S. patent application Ser. No. 08/342,280 when operating in a pragmatic trellis code mode (such as for 16, 32, 64, 128 and 256 QAM codes and for an 8-PSK code, by way of examples). This trellis demapper, which is designed with reduction in cost and complexity in mind, provides minimum storage requirements compared to a trellis code demapper employing ROM storage for QAM trellis codes.

More specifically, the present invention is directed to such a demapper for a plurality of codes that comprise a distinct code for each constellation set of symbols in the I,Q plane that includes (1) an even power of 2 number of symbols arranged in a square-grid bit-to-symbol mapping, (2) an odd power of 2 number of symbols arranged in a cross-grid bit-to-symbol mapping and/or (3) an 8-PSK Code. Respective I-channel and Q-channel RAMs, each of which includes a lookup table that is selectively programmed for each of the QAM codes, are employed in both the aforesaid categories (1) and (2). In the case of category (1), the respective outputs of the I-channel and Q-channel RAMs are directly forwarded as the output of the trellis demapper. In the case of category (2), the respective outputs of the I-channel and Q-channel RAMs are applied as inputs to a remapper RAM and the output of the remapper RAM is forwarded as the output of the trellis demapper. In the case of category (3), 8-PSK demapper logic means is employed for demapping the 8-PSK code, and the output of the demapper logic means is forwarded as the output of the trellis demapper. In those cases in which the trellis demapper is responsive to two or all three of categories (1), (2) and (3), a MUX select is employed to forward the output of a selected one of the categories as the output of the trellis demapper.

DESCRIPTION OF THE PREFERRED EMBODIMENT

Figure 1:
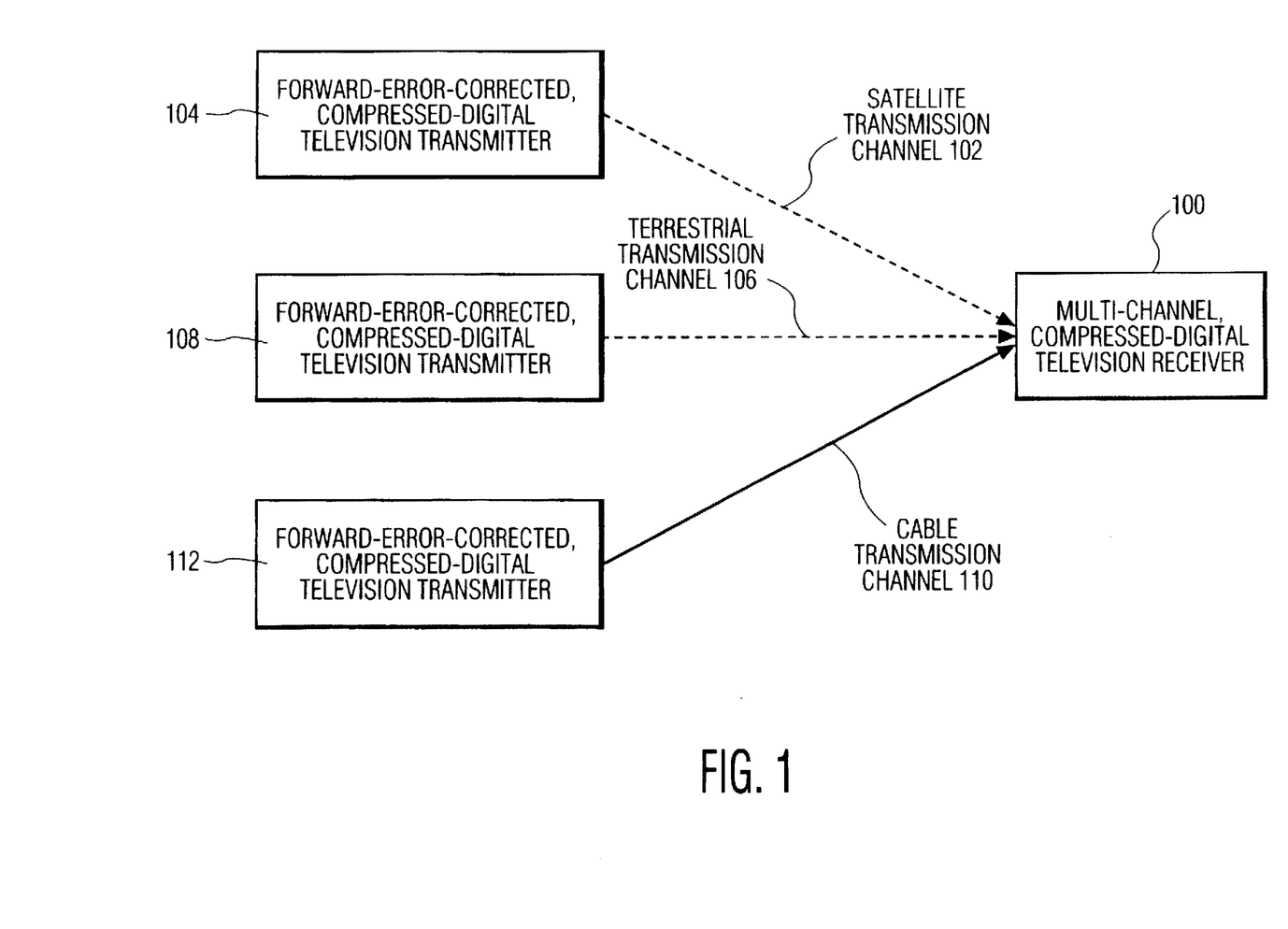
FIG. 1 (which is identical to FIG. 1 of the aforesaid copending U.S. patent application Ser. No. 08/342,280) illustrates the different types of transmission channels which may be received by a multi-channel compressed-digital television receiver transmitted from a forward-error-corrected compressed-digital television transmitter.

As shown in FIG. 1, multi-channel compressed-digital television receiver 100 is capable of selectively receiving digitally-encoded television data transmitted over each of a plurality of different channels. These plurality of channels include satellite transmission channel 102, which transmits digitally-encoded television data from forward-error-corrected television transmitter 104; terrestrial transmission channel 106, which transmits digitally-encoded television data from forward-error-corrected television transmitter 108; and cable transmission channel 110, which transmits digitally-encoded television data from forward-error-corrected television transmitter 112. As known in the art, forward-error-correction at the transmitter typically comprises convolutional encoding of successively-transmitted symbol packets of already encoded compressed-digital television data.

As further known in the art, while QSPK-based punctured codes are typically employed for transmission of convolutional encoded data over a satellite channel, higher alphabet (i.e., 8, 16, 32, 64, 128 and 256) n/n+1 pragmatic trellis codes could potentially be employed for PAM, PSK or QAM based transmission of convolutional encoded data over terrestrial or cable channels. Therefore, it is required that multi-channel receiver 100 incorporates a convolutional decoder that is capable of decoding any particular one of QSPK-based punctured or PAM, PSK or QAM based higher alphabet n/n+1 pragmatic trellis codes, depending on the selected one of the multi-channels then being received.

Figure 2:
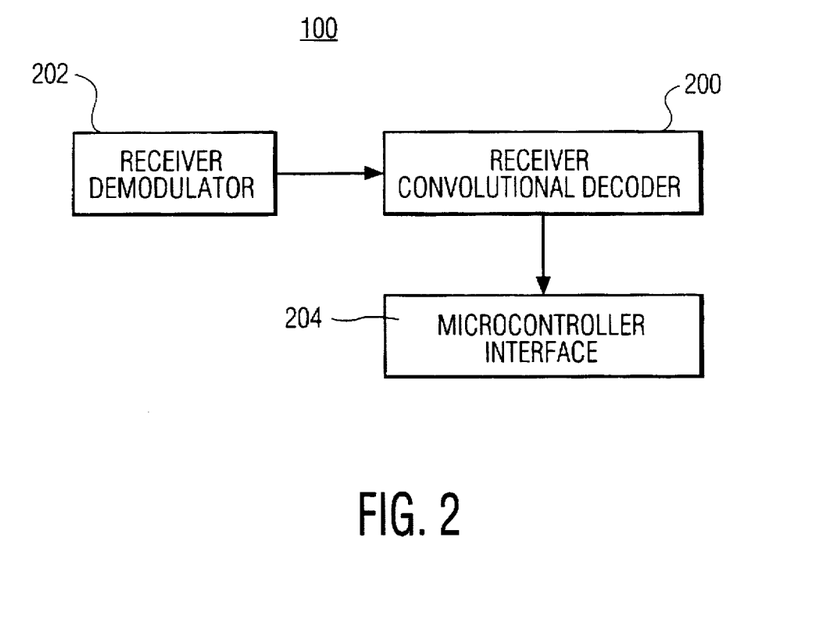
FIG. 2 (which is identical to FIG. 2 of the aforesaid copending U.S. patent application Ser. No. 08/342,280) is a block diagram showing the relationship among the convolutional decoder, the demodulator applying an input to the decoder, and a microcontroller interface to the decoder of the multi-channel compressed-digital television receiver of FIG. 1.

More specifically, multi-channel receiver 100 comprises digital processing apparatus which, as shown in FIG. 2, includes receiver convolutional decoder 200 and receiver demodulator 202 which, as known in the art, applies each of a series of successively-received convolutionally-encoded symbol packets as the signal input data to receiver convolutional decoder 200. Each successively-received symbol packet of this data defines a point in the in-phase (I), quadrature-phase (Q) plane The digital processing apparatus of multi-channel receiver 100 further comprises a microcontroller which includes microcontroller interface 204 for applying a control input to receiver convolutional decoder 200.

Figure 3:
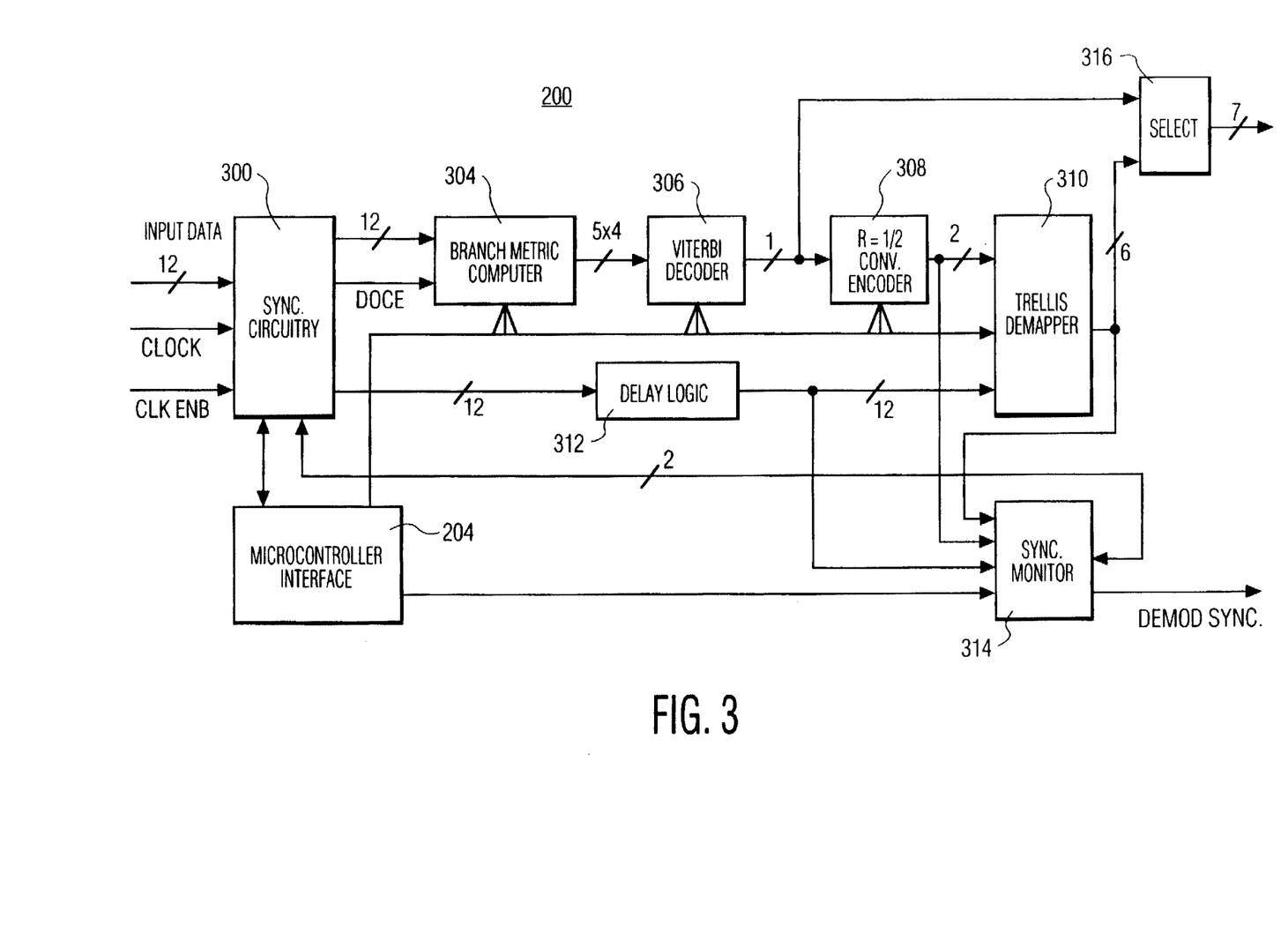
FIG. 3 (which is identical to FIG. 3b of the aforesaid copending U.S. patent application Ser. No. 08/342,280) is a block diagram of the structural elements of the convolutional decoder shown in FIG. 2, when programmed by the microcontroller interface to operate in a pragmatic trellis code decoding mode, which shows the coupling of the microcontroller interface of FIG. 2 to the structural elements of the convolutional decoder.

Microcontroller interface 204 provides a list of specifications to convolutional decoder 200 which, among other things, is capable of configuring the operation of convolutional decoder 200 as either a decoder for punctured codes or, alternatively, as a decoder for trellis codes. FIG. 3 shows convolutional decoder 200 configured for operation as a decoder for trellis codes. As shown in FIG. 3, the structural elements of receiver convolutional decoder 200 include synchronization circuitry 300, branch metric computer 304, Viterbi decoder 306, convolutional encoder 308, trellis demapper 310, delay logic 312, synchronization monitor 314 and select means 316.

The output data from demodulator 202 is applied as I,Q input data to synchronization circuitry 300. For illustrative purposes, it is assumed that each of the I and Q data is defined by 6 bits (i.e., the input data is applied over a total of 12 parallel input conductors). This permits each of 64×64=4096 distinct points in the I,Q plane to be defined by the 6-bit I and 6-bit Q components of the 12-bit input data. Synchronization circuitry 300 also receives clock and clock-enable (Clk Enb) inputs thereto. In addition, synchronization circuitry 300 both receives control data from microcontroller interface 204 and supplies data thereto, and is directly coupled to synchronization monitor 314.

Each of elements 302, 304, 306, 308 and 310 has control data applied thereto from microcontroller interface 204. Further, although not shown in FIG. 3, the clock is applied to these elements. Properly synchronized I and Q data is forwarded from synchronization circuitry 300 to branch metric computer 304 in response to data output clock enable (DOCE). Further, the properly synchronized I and Q data is forwarded through delay logic 312 to trellis demapper 310 and synchronization monitor 314.

Branch metric computer 306 (the details of which forms the subject matter of the aforesaid copending U.S. patent application Ser. No. 08/342,280) derives 4 separate 5-bit outputs in response to each of successively-received symbol packets. These 4 separate 5-bit outputs and the DOCE signal from branch metric computer 306 are applied as inputs to Viterbi decoder 306. Viterbi decoder 306, which is a Rate R=½, constraint length k=7 decoder, performs the Viterbi algorithm for trellis codes, wherein the 5-bit metric inputs from branch metric computer 306 are used to update the states and to make bit decisions. Viterbi decoder 306 employs add-compare-select (ACS) means, path metric storage means, and the memory for the survivor paths at each level in the the trellis. In addition, Viterbi decoder 306 also takes care of metric renormalizations to avoid a buildup and overflow of the accumulated metrics.

A 1-bit output from Viterbi decoder 306 is applied as an input to convolutional encoder 308. For trellis codes, convolutional encoder 308 serves to regenerate the best estimates of the two transmitted bits of the rate ½ embedded code. The output from encoder 308 is also applied to synchronization monitor 314. In addition, the 1-bit output from Viterbi decoder 306 is applied as an input to select means 316.

The 2-bit output from convolutional encoder 308 is applied to trellis demapper 310, which is responsible for making symbol decisions. More specifically, trellis demapper 310 uses the 2-bit output from convolutional encoder 308 for subset selection together with the delayed I and Q received symbol data forwarded thereto through delay logic 312 (in a manner to be described in detail below) to make these symbol decisions. A 6-bit output from trellis demapper 310 is applied as an input to both synchronization monitor 314 and select means 316.

Delay logic 312 accounts for the delay introduced by Viterbi decoder 306/encoder 308 and associated circuitry and synchronizes the data stream at the output of encoder 308 with the received symbol stream.

Synchronization monitor 314, which is coupled to synchronization circuitry 300, the output from trellis demapper 310, encoder 308, the output from delay logic 312 and microcontroller interface 204, uses the branch metric information in conjunction with an observation interval specification from microcontroller interface 204 to decide the synchronization status. It also provides information to synchronization circuitry 300 for optional automatic synchronization. In an automatic synchronization mode of operation, the internal synchronization circuitry is employed to perform the synchronization function. Alternatively, the synchronization could be performed from external circuitry. Synchronization monitor 314 is also used to provide a signal to the demodulator for resolving phase ambiguities. This signal is used for only the purpose of accounting for phase ambiguities in receiver demodulator 202. Further, synchronization monitor 314 supplies a demodulated synchronization signal for use by downstream components of receiver 100.

Select means 316, which receives the 1-bit output of Viterbi decoder 306 and the 6-bit output of trellis demapper 310 applied as inputs thereto, forwards all of these 7 bits to its output. This output data along with a clock and a DOCE signal are supplied from select means 316 for use by downstream components of receiver 100.

Figure 4:
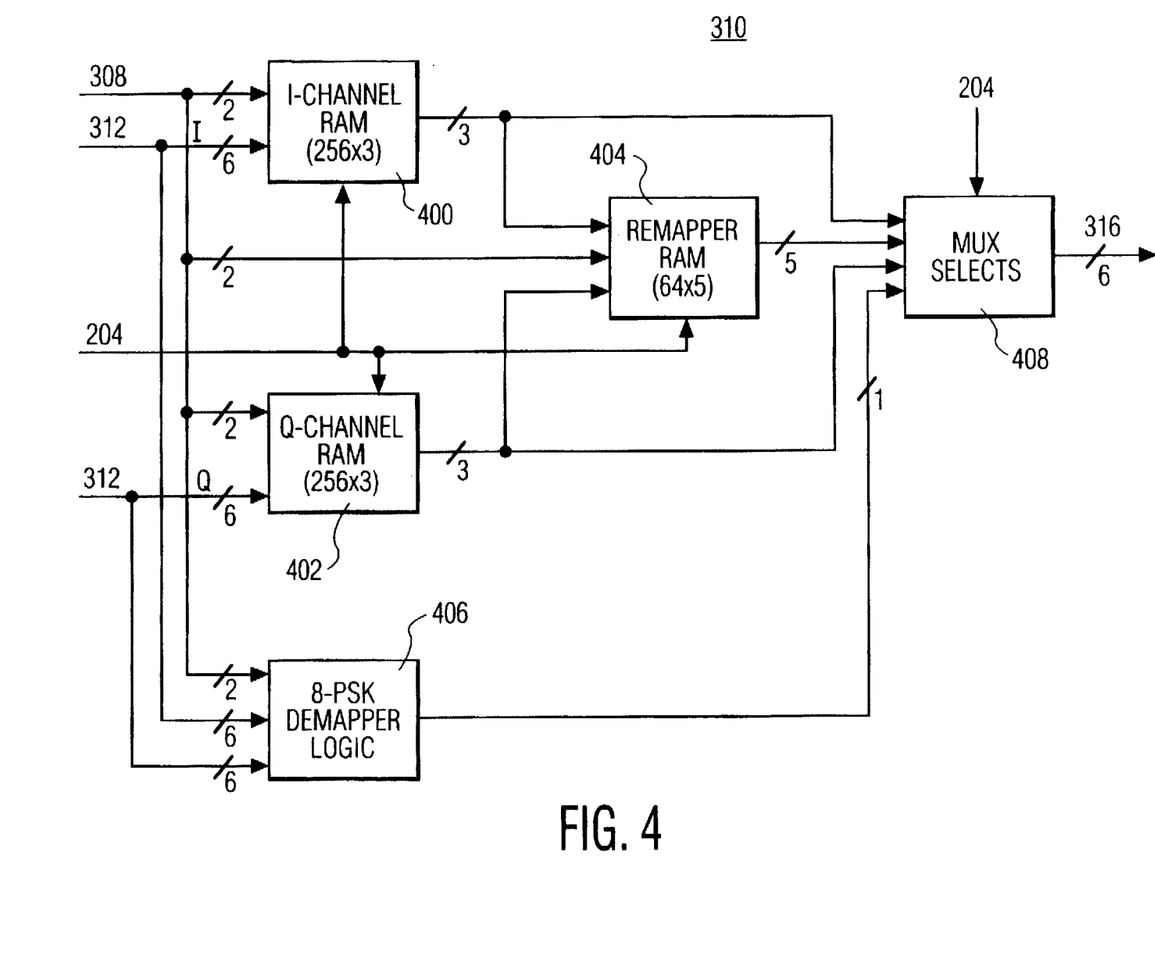
FIG. 4 is a block diagram of the structural elements of the trellis demapper shown in FIG. 3.

In accordance with the principles of the present invention, there is shown a block diagram of an embodiment of trellis demapper 310 that provides a minimal configuration of hardware capable of efficiently demapping each of rate ¾–16 QAM, rate ⅘–32 QAM, rate ⅚–64 QAM, rate 6/7–128 QAM, rate ⅞–256 QAM and rate ⅔–8-PSK delayed received codes applied as an input thereto. As shown in FIG. 4, demapper 310 comprises I-channel random access memory (RAM) 400, Q-channel RAM 402, remapper RAM 404, 8-PSK demapper logic means 406 and MUX selects 408.

The 2-bit code from the output of rate ½ convolutional encoder 308 of FIG. 3 is applied as a first input to I-channel RAM 400, Q-channel RAM 402, remapper RAM 404 and 8-PSK demapper logic means 406. The 6 bits out of the 12-bit output of delay logic 312 of FIG. 3 which manifest the I component of the position in the I,Q plane of the received symbol are applied as a second input to I-channel RAM 400. The 6 bits out of the 12-bit output of delay logic 312 which manifest the Q component of the position in the I,Q plane of the received symbol are applied as a second input to Q-channel RAM 402. Both the 6 bits out of the 12-bit output of delay logic 312 which manifest the I component and the 6 bits out of the 12-bit output of delay logic 312 which manifest the Q component of the position in the I,Q plane of the received symbol are respectively applied as second and third inputs to 8-PSK demapper logic means 406.

In addition, in accordance with that selected one of the various QAM codes then being received, each of I-channel RAM 400, Q-channel RAM 402 and remapper RAM 404 is preloaded during an initialization phase with programmable, precomputed I and Q lookup tables from microcontroller interface 204 applied as a control input thereto. No lookup tables are required by 8-PSK demapper logic means 406. Further, a control input from microcontroller interface 204 is applied to MUX selects 408 for selecting (1) both the 3-bit outputs of I-channel and Q-channel RAMs 400 and 402, (2) the 5-bit output of remapper RAM 404 or (3) the 1-bit output of 8-PSK remapper logic means 406. The 3-bit outputs of I-channel and Q-channel RAMs 400 and 402 are also applied, respectively, as second and third inputs to remapper RAM 404, while a 6-bit output from MUX selects 408 is applied as an input to select 316 of FIG. 3.

The 6-bit I component defines 64 ($2^6$) different I values, while the 6-bit Q component defines 64 ($2^6$) different Q values. Together, they define the received symbol as occupying a certain single one of a set of 4096 ($2^{12}$) data points in the I,Q plane. However, the largest constellation of transmitted symbols (i.e., 256 QAM) constitute a set of only 256 ($2^8$) symbols. For purposes of the present invention, this largest 256 QAM constellation, along with the smaller 16 ($2^4$) QAM and 64 ($2^6$) QAM constellations, which are even powers of 2, constitute a first demapping category. The smaller 32 ($2^5$) QAM and 128 ($2^7$) QAM constellations, which are odd powers of 2, constitute a second demapping category, while the 8-PSK constellation by itself constitutes a third demapping category. Each of these three demapping categories are discussed below, in turn.

The bit-to-symbol mapping for each of the 16, 64 and 256 QAM constellations belonging to the first category are arranged in a square grid. Consider first the bit-to-symbol mapping for the 16 QAM constellation, shown below in Table 1 in both octal and binary representations.

TABLE 1

| OCTAL | | BINARY | OCTAL | | BINARY | OCTAL | | BINARY | OCTAL | | BINARY |
|---|---|---|---|---|---|---|---|---|---|---|---|
| 00 | • | 000-000 | 01 | • | 000-001 | 04 | • | 000-100 | 05 | • | 000-101 |
| 02 | • | 000-010 | 03 | • | 000-011 | 06 | • | 000-110 | 07 | • | 000-111 |
| 10 | • | 001-000 | 11 | • | 001-001 | 14 | • | 001-100 | 15 | • | 001-101 |
| 12 | • | 001-010 | 13 | • | 001-011 | 16 | • | 001-110 | 17 | • | 001-111 |

The two lowest significant digits, shown in bold type, of each binary representation of each constellation symbol, are determined by the respective binary values of the 2-bit input to each of I-channel and Q-channel RAMs 400 and 402 from encoder 308. As indicated in Table 1, the two lowest binary significant digits of 00 value correspond with a lower octal significant digit of either 0 or 4; the two lowest binary significant digits of 01 value correspond with a lower octal significant digit of either 1 or 5; the two lowest binary significant digits of 10 value correspond with a lower octal significant digit of either 2 or 6, and the two lower binary significant digits of 11 value correspond with a lower octal significant digit of either 3 or 7. Further, 00 lowest binary significant digits (0 or 4 lower octal significant digit) occupy only cells on odd rows and odd columns of Table 1; 01 lowest binary significant digits (1 or 5 lower octal significant digit) occupy only cells on odd rows and even columns of Table 1; 10 lowest binary significant digits (2 or 6 lower octal significant digit) occupy only cells on even rows and odd columns of Table 1, and 11 lowest binary significant digits (3 or 7 lower octal significant digit) occupy only cells on odd rows and odd columns of Table 1

In this manner, the set of 16 symbols of the Table 1 constellation may be effectively divided into separate 00, 01, 10 and 11 subsets of 4 symbols each, as shown, respectively, in the following Tables 1-00, 1-01, 1-10 and 1-11.

TABLE 1-00

| Gray-code Mapping | Gray-code Mapping |
| --- | --- |
| Q-I | Q-I |
| • 0-0 | • 0-1 |
| • 1-0 | • 1-1 |

TABLE 1-01

| Gray-code Mapping | Gray-code Mapping |
| --- | --- |
| Q-I | Q-I |
| • 0-0 | • 0-1 |
| • 1-0 | • 1-1 |

TABLE 1-10

| Gray-code Mapping | Gray-code Mapping |
| --- | --- |
| Q-I | Q-I |
| • 0-0 | • 0-1 |
| • 1-0 | 1-1 |

TABLE 1-11

| Gray-code Mapping | Gray-code Mapping |
| --- | --- |
| Q-I | Q-I |
| • 0-0 | • 0-1 |
| • 1-0 | • 1-1 |

In each cell of Tables 1-00, 1-01, 1-10 and 1-11, the binary value of each of the Q and I bits is the same as the binary value of each of the lowest 2 significant bits of the corresponding cell of Table 1 shown in plain type (i.e. the 2 bits to the immediate left of the 2 bits shown in bold type in each cell of Table 1). This results in the Q and I binary values of the 00, 01, 10 and 00 subsets shown in corresponding cells of respective Tables 1-00, 1-01, 1-10 and 1-11 being the same as one another. Further, as indicated in Tables 1-00, 1-01, 1-10 and 1-11, the bit-to-symbol mapping has been selected to directly provide a binary Gray code mapping in which the respective I and Q components of each symbol in the I,Q plane remain independent of one another. Thus, in the horizontal (i.e., I component) direction from left-to-right, the values represented by the binary Gray code are 0 and 1 in each of Tables 1-00, 1-01, 1:10 and 1-11. Similarly, in the vertical (i.e., Q component) direction from top-to-bottom, the values represented by the binary Gray code are also 0 and 1 in each of Tables 1-00, 1-01, 1-10 and 1-11.

The selected bit-to-symbol mapping for each of the 64 and 256 QAM constellations of the first category (shown in octal representation in the following Tables 2 and 3), is similar, in principle, to the selected bit-to-symbol mapping for 16 QAM constellation described above.

TABLE 2

| OC-TAL | OCTAL | OCTAL | OCTAL | OCTAL | OCTAL | OCTAL | OCTAL |
| --- | --- | --- | --- | --- | --- | --- | --- |
| 00 | 01 | 04 | 05 | 14 | 15 | 10 | 11 |
| 02 | 03 | 06 | 07 | 16 | 17 | 12 | 13 |
| 20 | 21 | 24 | 25 | 34 | 35 | 30 | 31 |
| 22 | 23 | 26 | 27 | 36 | 37 | 32 | 33 |
| 60 | 61 | 64 | 65 | 74 | 75 | 70 | 71 |
| 62 | 63 | 66 | 67 | 76 | 77 | 72 | 73 |
| 40 | 41 | 44 | 45 | 54 | 55 | 50 | 51 |
| 42 | 43 | 46 | 47 | 56 | 57 | 52 | 53 |

TABLE 3

| OCTAL REPRESENTATION | | | | | | | | | | | | | | | |
| --- | --- | --- | --- | --- | --- | --- | --- | --- | --- | --- | --- | --- | --- | --- | --- |
| 000 | 001 | 004 | 005 | 014 | 015 | 010 | 011 | 030 | 031 | 034 | 035 | 024 | 025 | 020 | 021 |
| 002 | 003 | 006 | 007 | 016 | 017 | 012 | 013 | 032 | 033 | 036 | 037 | 026 | 027 | 022 | 023 |
| 040 | 041 | 044 | 045 | 054 | 055 | 050 | 051 | 070 | 071 | 074 | 075 | 064 | 065 | 060 | 061 |
| 042 | 043 | 046 | 047 | 056 | 057 | 052 | 053 | 072 | 073 | 076 | 077 | 066 | 067 | 062 | 063 |
| 140 | 141 | 144 | 145 | 154 | 155 | 150 | 151 | 170 | 171 | 174 | 175 | 164 | 165 | 160 | 161 |
| 142 | 143 | 146 | 147 | 156 | 157 | 152 | 153 | 172 | 173 | 176 | 177 | 166 | 167 | 162 | 163 |
| 100 | 101 | 104 | 105 | 114 | 115 | 110 | 111 | 130 | 131 | 134 | 135 | 124 | 125 | 120 | 121 |
| 102 | 103 | 106 | 107 | 116 | 117 | 112 | 113 | 132 | 133 | 136 | 137 | 126 | 127 | 122 | 123 |
| 300 | 301 | 304 | 305 | 314 | 315 | 310 | 311 | 330 | 331 | 334 | 335 | 324 | 325 | 320 | 321 |
| 302 | 303 | 306 | 307 | 316 | 317 | 312 | 313 | 332 | 333 | 336 | 337 | 326 | 327 | 322 | 323 |
| 340 | 341 | 344 | 345 | 354 | 355 | 350 | 351 | 370 | 371 | 374 | 375 | 364 | 365 | 360 | 361 |
| 342 | 343 | 346 | 347 | 356 | 357 | 352 | 353 | 372 | 373 | 376 | 377 | 366 | 367 | 362 | 363 |
| 240 | 241 | 244 | 245 | 254 | 255 | 250 | 251 | 270 | 274 | 274 | 275 | 264 | 265 | 260 | 261 |
| 242 | 243 | 246 | 245 | 256 | 257 | 252 | 253 | 272 | 273 | 276 | 277 | 266 | 267 | 262 | 263 |
| 200 | 201 | 204 | 205 | 214 | 215 | 210 | 211 | 230 | 231 | 234 | 235 | 224 | 225 | 220 | 221 |
| 202 | 203 | 206 | 207 | 216 | 217 | 212 | 213 | 232 | 233 | 236 | 237 | 226 | 227 | 222 | 223 |

Specifically, the octal representation shown in each cell of Tables 2 and 3 can be converted to binary representation, whereby (1) the 2 least significant bits of such converted binary representation of Table 2 effectively divides the set of 64 symbols into separate 00, 01, 10 and 11 subsets of 16 symbols each, and (2) the 2 least significant bits of such converted binary representation of Table 3 effectively divides the set of 256 symbols into separate 00, 01, 10 and 11 subsets of 64 symbols each. In each cell of subsets 00, 01, 10 and 11 of the Table 2 set, the binary value of each of the Q and I bits is the same as the binary value of each of the 4 significant bits in binary representation of the corresponding cell of Table 2 which are immediately higher than the 2 lowest significant bits in binary representation of that corresponding cell of Table 2. Similarly, in each cell of subsets 00, 01, 10 and 11 of the Table 3 set, the binary value of each of the Q and I bits is the same as the binary value of each of the 6 significant bits in binary representation of the corresponding cell of Table 3 which are immediately higher than the 2 lowest significant bits in binary representation of that corresponding cell of Table 3. This results in the Q and I binary values of the 00, 01, 10 and 00 subsets of each of the Table 2 and 3 sets being the same as one another. Further, the bit-to-symbol mapping in each of Tables 2 and 3 has been selected to directly provide a binary Gray code mapping in which the respective I and Q components of each symbol in the I,Q plane remain independent of one another. Thus, in the horizontal (i.e., I component) direction from left-to-right, the values represented by the binary Gray code are 0, 1, 2 and 3 in each of the 00, 01, 10 and 00 subsets of the Table 2 set, and the values represented by the binary Gray code are 0, 1, 2, 3, 4, 5, 6 and 7 in each of the 00, 01, 10 and 00 subsets of the Table 3 set. Similarly, in the vertical (i.e., Q component) direction from top-to-bottom, the values represented by the binary Gray code are 0, 1, 2 and 3 in each of the 00, 01, 10 and 00 subsets of the Table 2 set, and the values represented by the binary Gray code are 0, 1, 2, 3, 4, 5, 6 and 7 in each of the 00, 01, 10 and 00 subsets of the Table 3 set.

Returning to FIG. 4, I-channel RAM 400 is initially preloaded by microcontroller interface 204 with a 1-bit lookup table in the 16 QAM (Table 1) case, with a 2-bit lookup table in the 64 QAM (Table 2) case, and with a 3-bit lookup table in the 256 QAM (Table 3) case. Similarly, Q-channel RAM 402 is initially preloaded by microcontroller 204 with a 1-bit lookup table in the 16 QAM (Table 1) case, with a 2-bit lookup table in the 64 QAM (Table 2) case, and with a 3-bit lookup table in the 256 QAM (Table 3) case. The lookup table of I-channel RAM 400, in response to being addressed by the 6-bit I input from delay logic 312 and the 2-bit I input from convolutional encoder 308, reads out the binary Gray code I component of that column of constellation symbols which is closest in distance in the I (horizontal) direction to the I component position of the delayed received symbol. Similarly, The lookup table of Q-channel RAM 402, in response to being addressed by the 6-bit Q input from delay logic 312 and the 2-bit I input from convolutional encoder 308, reads out the binary Gray code Q component of that row of constellation symbols which is closest in distance in the Q (vertical) direction to the Q component position of the delayed received symbol.

In the case of the first category (i.e., 16, 64 and 256 QAMs), MUX selects 408 is operated by the control input thereto from microcontroller interface 204 to forward the respective lookup table readout outputs from I-channel RAM 400 and Q-channel RAM as an input to select 316 of FIG. 3. It will be noted that the identity of the 00, 01, 10 and 11 subsets is lost in the readout outputs from I-channel RAM 400 and Q-channel RAM forwarded through select 316 of FIG. 3 to a downstream portion of the multi-channel receiver. However, as shown in FIG. 3, the 1-bit output of Viterbi decoder 306 is also forwarded through select 316 of FIG. 3 to the downstream portion of the multi-channel receiver. Since the 2-bit output of convolutional encoder 308 (which is used in trellis demapper 310 to define the 00, 01, 10 and 11 subsets) is derived from the 1-bit output of Viterbi decoder 306, the 00, 01, 10 and 11 subsets may again be derived in the downstream portion from the 1-bit output of Viterbi decoder forwarded thereto.

The 32 ($2^5$) and 128 ($2^7$) QAM constellations belong to category 2. Category 2 constellations, because they comprise an odd power of 2 symbols, the symbols are arranged in a cross grid, rather than a square grid. Further, the bit-to-symbol mapping of category 2 constellation sets is not capable of directly providing binary Gray code mapping for the 00, 01, 10 and 11 subsets thereof. Therefore, remapping of the bit-to-symbol mapping of the 00, 01, 10 and 11 category 2 subsets is required to obtain the proper binary Gray code mapping of the symbols of each subset.

In this regard, the following Table 4 shows, in octal representation, the bit-to-symbol mapping of the cross-grid arrangement for the 32 QAM constellation set and Tables 4-00, 4-01, 4-10 and 4-11 show, respectively, the different remapping of each of the 00, 01, 10 and 11 subsets of the 32 QAM constellation set. Similarly, the following Table 5 shows, in octal representation, the bit-to-symbol mapping of the cross-grid arrangement for the 128 QAM constellation set and Table 5a shows the common remapping of each of the 00, 01, 10 and 11 subsets of the 128 QAM constellation set.

TABLE 4

| OCTAL | OCTAL | OCTAL | OCTAL | OCTAL | OCTAL |
|---|---|---|---|---|---|
|  | 30 | 21 | 20 | 31 |  |
| 17 | 26 | 07 | 06 | 27 | 16 |
| 11 | 34 | 01 | 00 | 35 | 10 |
| 13 | 36 | 03 | 02 | 37 | 12 |
| 15 | 24 | 05 | 04 | 25 | 14 |
|  | 32 | 23 | 22 | 33 |  |

TABLE 4-00

| Binary | Binary | Binary |  | Binary | Binary | Binary |
|---|---|---|---|---|---|---|
| 1100 | 1101 | 1111 | → | 110 | 100 | 010 |
| 0100 | 0101 | 0111 | → | 111 | 000 | 010 |
| 0000 | 0001 | 0011 | → | 101 | 001 | 011 |

TABLE 4-01

| Binary | Binary | Binary |  | Binary | Binary | Binary |
|---|---|---|---|---|---|---|
| 1100 | 1101 | 1111 | → | 100 | 100 | 110 |
| 0100 | 0101 | 0111 | → | 010 | 000 | 111 |
| 0000 | 0001 | 0011 | → | 011 | 000 | 101 |

TABLE 4-10

| Binary | Binary | Binary |  | Binary | Binary | Binary |
|---|---|---|---|---|---|---|
| 1100 | 1101 | 1111 | → | 101 | 001 | 011 |
| 0100 | 0101 | 0111 | → | 111 | 000 | 010 |
| 0000 | 0001 | 0011 | → | 110 | 100 | 010 |

TABLE 4-11

| Binary | Binary | Binary |    | Binary | Binary | Binary |
|--------|--------|--------|----|--------|--------|--------|
| 1100   | 1101   | 1111   | →  | 011    | 001    | 101    |
| 0100   | 0101   | 0111   | →  | 010    | 000    | 111    |
| 0000   | 0001   | 0011   | →  | 100    | 100    | 110    |

TABLE 5

| octal | octal | octal | octal | octal | octal | octal | octal | octal | octal | octal | octal |
|-------|-------|-------|-------|-------|-------|-------|-------|-------|-------|-------|-------|
|       |       | 114   | 115   | 104   | 105   | 124   | 125   | 120   | 121   |       |       |
|       |       | 116   | 117   | 106   | 107   | 126   | 127   | 122   | 123   |       |       |
| 100   | 101   | 000   | 001   | 004   | 005   | 024   | 025   | 020   | 021   | 134   | 135   |
| 102   | 103   | 002   | 003   | 006   | 007   | 026   | 027   | 022   | 023   | 136   | 137   |
| 110   | 111   | 010   | 011   | 014   | 015   | 034   | 035   | 030   | 031   | 130   | 131   |
| 112   | 113   | 012   | 013   | 016   | 017   | 036   | 037   | 032   | 033   | 132   | 133   |
| 150   | 151   | 050   | 051   | 054   | 055   | 074   | 075   | 070   | 071   | 170   | 171   |
| 152   | 153   | 052   | 053   | 056   | 057   | 076   | 077   | 072   | 073   | 172   | 173   |
| 154   | 155   | 040   | 041   | 044   | 045   | 064   | 065   | 060   | 061   | 160   | 161   |
| 156   | 157   | 042   | 043   | 046   | 047   | 066   | 067   | 062   | 063   | 162   | 163   |
|       |       | 140   | 141   | 144   | 145   | 164   | 165   | 174   | 175   |       |       |
|       |       | 142   | 143   | 146   | 147   | 166   | 167   | 176   | 177   |       |       |

TABLE 5a

| OCTAL REPRESENTATION | | | | | | | | | | | | |
|----|----|----|----|----|----|----|----|----|----|----|----|----|
| 70 | 71 | 73 | 72 | 76 | 77 | →  | 23 | 23 | 21 | 25 | 24 | 27 |
| 60 | 61 | 63 | 62 | 66 | 67 | →  | 20 | 00 | 01 | 05 | 04 | 27 |
| 20 | 21 | 23 | 22 | 26 | 27 | →  | 22 | 02 | 03 | 07 | 06 | 26 |
| 30 | 31 | 33 | 32 | 36 | 37 | →  | 32 | 12 | 13 | 17 | 16 | 36 |
| 10 | 11 | 13 | 12 | 16 | 17 | →  | 33 | 10 | 11 | 15 | 14 | 34 |
| 00 | 01 | 03 | 02 | 06 | 07 | →  | 33 | 30 | 31 | 35 | 37 | 37 |

In Tables 4 and 5 (as in Tables 1, 2 and 3) cells in which the least significant digit of the octal representation is a 0 or a 4 belong to the 00 subset; cells in which the least significant digit of the octal representation is a 1 or a 5 belong to the 01 subset; cells in which the least significant digit of the octal representation is a 2 or a 6 belong to the 10 subset, and cells in which the least significant digit of the octal representation is a 3 or a 7 belong to the 11 subset. If the octal representation of each cell of Tables 4 and 5 is converted to binary representation, those binary significant bits higher than the two lowest binary significant bits constitute the output of remapper RAM 404

Remapper RAM 404 is initially preloaded by microcontroller interface 204 with a 3-bit lookup table in the 32 QAM (Table 4) case, and with a 5-bit lookup table in the 128 QAM (Table 5) case. In the 32 QAM case, the remapper lookup table is readout in response to a 2-bit output from I-channel RAM 400 applied as a first input thereto, a 2-bit output from Q-channel RAM 402 applied as a second input thereto, and the 2-bit output from convolutional encoder 308 applied as a third input thereto. In the 128 QAM case, the remapper lookup table is readout in response to a 3-bit output from I-channel RAM 400 applied as a first input thereto and a 3-bit output from Q-channel RAM 402 applied as a second input thereto.

The respective binary values of the 2-bit output from the lookup table of each of I-channel RAM 400 and Q-channel RAM 402 for each of the 00, 01, 10 and 11 subsets of the set of the 32 QAM constellation is limited to only 3 certain ones of the 4 possible binary values that 2 bits may assume. Specifically, as shown in the left portion of each of Tables 4-00, 4-01, 4-10 and 411, the respective 2-bit outputs from RAMs 400 and 402 provide a 4 binary bit bit-to-symbol mapping of a certain 9 symbol portion of a possible 16 symbol constellation for each of the 00, 01, 10 and 11 subsets, with the two least significant bits of the 4 binary bits of each cell of each subset being the 2-bit I component from RAM 400 and the the two most significant bits of the 4 binary bits being the 2-bit Q component from RAM 402. As shown in the left portion of each of Tables 4-00, 4-01, 4-10 and 4-11, the 4 binary bit bit-to-symbol mapping for each of subsets 00, 01, 10 and 11 is the same as one another. Remapper 404 remaps the 4 binary bit bit-to-symbol mapping for each of these subsets 00, 01, 10 and 11 into a different 3 binary bit bit-to-symbol mapping for each of these 4 subsets, as shown, respectively, in the right portion of each of Tables 4-00, 4-01, 4-10 and 4-11. A different 3 binary bit bit-to-symbol remapping for each of these 4 subsets is required because the respective shapes of the 8 cells of the 32 QAM symbol constellation set (shown in Table 4) making up each of these 4 subsets is non-symmetric with respect to one another. Further, because the 3 binary bit bit-to-symbol mapping for each of these 4 subsets shown, respectively, in the right portion of each of Tables 4-00, 4-01, 4-10 and 4-11 comprises 9 cells, rather than the proper 8 cells, it is necessary to duplicate the 3 binary bit bit-to-symbol mapping in one pair of 2 adjacent cells of the 9 cells of each of the 4 subsets, which pair of 2 adjacent cells occupy a single corner of each of Tables 4-00, 4-01, 4-10 and 4-11. The loss in performance due to this duplication is considered to be negligible.

In the case of the 128 QAM constellation set, the respective binary values of the 3-bit output from the lookup table of each of I-channel RAM 400 and Q-channel RAM 402 for each of the 00, 01, 10 and 11 subsets thereof is limited to that part of 6 binary bit bit-to-symbol mapping which comprises the 36 symbols shown in octal representation in the left portion of each of Table 5a. Remapper RAM 404 remaps the 36 symbols shown in octal representation in the left portion of each of Table 5a into the 36 symbols shown in octal representation in the right portion of each of Table 5a for each of the 00, 01, 10 and 11 subsets of the 128 QAM constellation set. The same bit-to-symbol remapping may be employed for each of these 4 subsets because the respective shapes of the 32 cells of the 128 QAM symbol constellation set (shown in Table 5) making up each of these 4 subsets is symmetric with respect to one another. Further, because the bit-to-symbol mapping for each of these 4 subsets shown in the right portion of each of Table 5a comprises 36 cells, rather than the proper 32 cells, it is necessary to duplicate the 3 binary bit bit-to-symbol mapping in four pairs of 2 adjacent cells of the 36 cells, in which each of the 4 pairs of 2 adjacent cells occupy a different one of the 4 corners of Table 5a. Again, the loss in performance due to this duplication is considered to be negligible.

Figure 5:
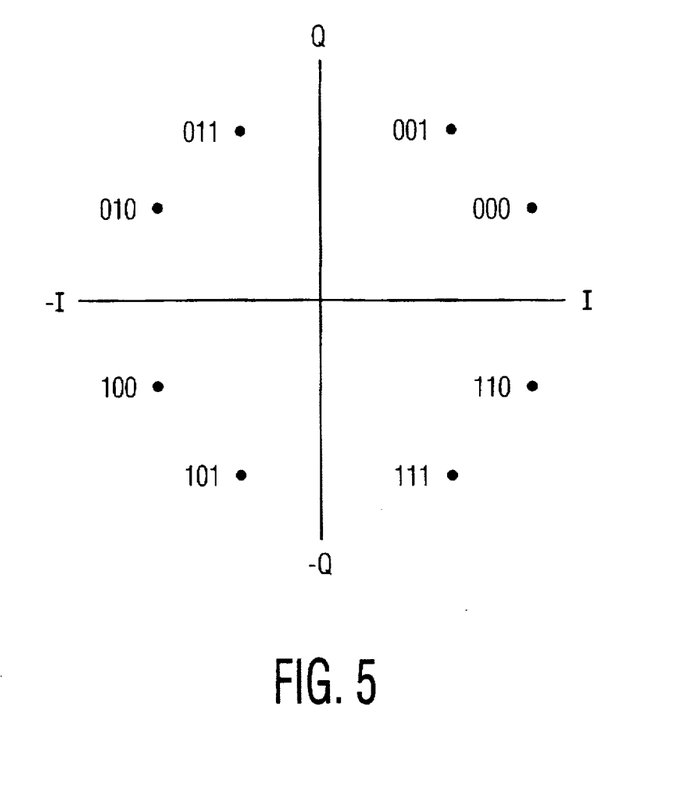
FIG. 5 illustrates the bit-to-symbol mapping for trellis-coded 8-PSK (rate R=⅔ encoded).

Referring now to FIG. 5, there is shown a 3 binary bit bit-to-symbol mapping for trellis coded 8-PSK in the I, Q plane. As indicated, the symbols are symmetrically distributed about the I-Q origin, with each of the symbols being angularly offset by either 22.5° or 67.5° with respect to the I axis. The bit-to-symbol mapping is such that the two least significant binary digits divide the 8-PSK set of symbols into 00, 01, 10 and 11 subsets, in which each subset includes 2 symbols. The binary value of the most significant of the 3 bits is used to differentiate between the 2 symbols in each of the 4 subsets. Specifically, the binary value of the most significant of the 3 bits in the upper (i.e., first and second) quadrants of the I,Q plane is "0" and he binary value of the most significant of the 3 bits in the lower (i.e., third and fourth) quadrants of the I,Q plane is "1".

Returning to FIG. 4, 8-PSK demapper logic means 406 does not use a lookup table directly to make the decision as to which of the 2 symbols $(I_1 Q_1)$ and $(I_2 Q_2)$ in that one of the 00, 01, 10 and 11 subsets selected by the 2-bit input from convolutional encoder 308 to 8-PSK demapper logic means 406 is closer to the data point (I, Q) of the received symbol determined by the 6-bit I and 6-bit Q inputs from delay logic 312 to 8-PSK demapper logic means 406. The only operation that needs to be performed in order to make this decision can be decided by making the following logical comparison by 8-PSK demapper logic means 406:

IF $I \times I_1 < Q \times Q_2$, then    Output = 1;
ELSE                                     Output = 0.

This comparison can be implemented using either lookup tables to perform the multiplications or an explicit multiplication can be performed. For the offset 8-PSK constellation shown in FIG. 5, the multiplication values are all sines and cosines of 22.5°. This reduces to products by 10 sin 22.5°=4 (to one significant figure) and 10 cos 22 5° =9 (to one significant figure). Since both I and Q are multiplied by the sine and cosine factor, a multiplication by 10 makes no change in the comparison results. A binary multiplication by 9 requires a shift operation (no additional hardware) and an adder. A binary multiplication by 4 is a simple shift operation and requires no extra hardware. Based on the comparison, the proper one of the two constellation symbols of the selected subset can be chosen. Further, it has been found that the losses due to the roundoff (i.e. not using the exact sine and cosine values) is negligible, since the decision regions are altered by only 4° in the worst case. This small difference makes very little difference in the error performance ($<10^{-3}$ symbol error probabilities) in all regions of interest. A table of multiplications and shifts for each subset is detailed in the following Table 6.

TABLE 6

| PRODUCT | SUBSET 00 | SUBSET 01 | SUBSET 10 | SUBSET 11 |
|---------|-----------|-----------|-----------|-----------|
| $I_1$   | +9        | +4        | −9        | +4        |
| $Q_2$   | −4        | −9        | −4        | −9        |

The storage requirements for the embodiment of the trellis demapper of the present invention shown in FIG. 4 are minimal. I-channel and Q-channel RAMs 400 and 402 together need store only 2×256×3=1,536 bits for all the different above-described modulation schemes. This is true because the I and Q components remain independent throughout the operation of each of RAMs 400 and 402. Utilizing conventional trellis demapping techniques, in which the I and Q components do not remain independent throughout, a read only memory (ROM) having a storage capacity of about 8,000 bits would be required for all the different above-described modulation schemes. For the above-described 32 and 128 QAM modulation schemes, an additional 64×5=320 bits of RAM is required by remapper RAM 404 of FIG. 4. Therefore, the total storage requirements for the embodiment of the trellis demapper of the present invention shown in FIG. 4 is 1,536+320=1,856 bits.

It is apparent that the trellis demapper for a convolutional decoder of the present invention may be generalized to a first case in which the largest QAM constellation trellis code which is an even power of 2 includes $2^{2y}$ symbols arranged in a square grid, where y is a positive integer having a value of at least 2, and a second case in which the QAM constellation trellis code in which the largest QAM constellation trellis code which is an odd power of 2 includes $2^z$ symbols arranged in a cross grid, where z is an odd positive integer having a value of at least 5. The first case includes both the 16, 64 and 256 QAM constellation trellis codes described above and any QAM constellation trellis code larger than 256 (i.e., where y has a value larger than 4). The second case includes both the 32 and 128 QAM constellation trellis codes described above and any QAM constellation trellis code larger than 128, (i.e., where z is an odd positive integer having a value larger than 7). In the first case, where the symbols are arranged in a square grid, a value of y larger than 4 does not result in any loss in performance. However, in the second case, where the symbols are arranged in a cross grid, a value of z larger than 7 does result in some loss in performance because remapping requires duplication of the bits mapping the corner cells of the constellation subset remapped grid of cells (e.g., 2×2=4 duplications at each of the 4 corners of the 12×12 grid for a 128 ($2^7$) remapped symbol subset of a 512 ($2^9$) symbol constellation or 4×4=16 duplications at each of the 4 corners of the 24×24 grid for a 512 ($2^9$) remapped symbol subset of a 2,048 ($2^{11}$) symbol constellation, by way of examples).

Generalizing further, the number of different I component values and the number of different Q component values of received symbols that may be applied, respectively, as inputs to I-channel RAM 400, Q-channel RAM 402 and 8-PSK demapper logic means 406 is each a positive integer $2^x$, where x>y and x>z/2.

Although I-channel RAM 400,-Q-channel RAM 402 and remapper RAM 404 are shown as separate items in FIG. 4, it should be understand that in practice, any two or all three of these RAMs can be combined in a single physical device.

What is claimed is:

1. In a convolutional decoder of a plurality of pragmatic trellis codes each of which is defined by a series of convolutionally-encoded symbol packets applied as in-phase (I) and quadrature-phase (Q) digital input signals thereto; wherein said plurality of pragmatic trellis codes comprise a distinct code for each constellation set of symbols in the I,Q plane that includes an even power of 2 number of symbols arranged in a square-grid bit-to-symbol mapping to produce square-grid symbol constellations, with the largest of said square-grid symbol constellations including $2^{2y}$ symbols, where y is a first positive integer having a given value of at least 2; and wherein said convolutional decoder includes a trellis demapper for demapping each of said plurality of pragmatic trellis codes; the improvement wherein (1) the bit-to-symbol mapping of said square grid of each constellation set is such that alternate cells of odd rows of said square grid define a first subset of symbols, the remaining cells of odd rows of said square grid define a second subset of symbols, alternate cells of even rows of said square grid define a third subset of symbols, and the remaining cells of even rows of said square grid define a fourth subset of symbols, and (2) said trellis demapper comprises:

an I-channel random access memory (RAM) having an effective depth of $2^{(x+2)}$ storage locations, where x is a second positive integer having a given value larger than said first positive integer, each storage location having an effective width at least sufficient to store an entry of an I-defining lookup table of y-bits;

a Q-channel RAM having an effective depth of $2^{(x+2)}$ storage locations, each storage location having an effective width at least sufficient to store an entry of a Q-defining lookup table of y-bits;

first means for applying a first x-bit input to said I-channel RAM to define the value of said in-phase (I) digital input signal and for applying a second x-bit input to said Q-channel RAM to define the value of said quadrature (Q) digital input signal;

second means for applying a 2-bit input to both said I-channel RAM and said Q-channel RAM to define a selected one of said four subsets in accordance with the binary value of said applied 2-bit input;

third means for preloading said lookup table of said I-channel RAM in accordance with a selected one of said constellation sets of symbols such that the bits mapping the I component of that symbol of the selected one of said four subsets of said selected one of said constellation sets which is closest in value to the value defined by the in-phase (I) digital input signal to said I-channel RAM is read out as the output of said I-channel RAM; and fourth means for preloading said lookup table of said Q-channel RAM in accordance with a selected one of said constellation sets of symbols such that the bits mapping the Q component of that symbol of the selected one of said four subsets of said selected one of said constellation sets which is closest in value to the value defined by the quadrature (Q) digital input signal to said Q-channel RAM is read out as the output of said Q-channel RAM.

2. The convolutional decoder defined in claim 1, wherein:

said bit-to-symbol mapping of said square grid of each constellation set is such that said third means employs binary Gray-coded bits to bit map said preloaded lookup table of said I-channel RAM, and said fourth means employs Gray-coded binary bits to bit map said preloaded lookup table of said Q-channel RAM.

3. The convolutional decoder defined in claim 2, wherein:

said constellation sets of symbols in the I,Q plane that include a different even power of 2 number of symbols arranged in a square grid include a 16 symbol QAM constellation, a 64 symbol QAM constellation and a 256 symbol QAM constellation;

the value of y is 3; and the value of x is 6.

4. The convolutional decoder defined in claim 1, wherein:

said plurality of pragmatic trellis codes also comprise a distinct code for each constellation set of symbols in the I,Q plane that includes an odd power of 2 number of symbols arranged in a cross-grid bit-to-symbol mapping to produce cross-grid symbol constellations, with the largest of said cross-grid symbol constellations including $2^z$ symbols, where z is a third positive integer having a given value of at least 5 such that the value x of said second positive integer is larger than the value of z/2, and the bit-to-symbol mapping of said cross grid of each constellation set being such that alternate cells of odd rows of said cross grid define a first subset of symbols, the remaining cells of odd rows of said cross grid define a second subset of symbols, alternate cells of even rows of said cross grid define a third subset of symbols, and the remaining cells of even rows of said cross grid define a fourth subset of symbols; and wherein:

said lookup table of said I-channel RAM when preloaded by said third means in accordance with said selected one of said constellation sets being an odd power of 2 symbols (1) provides the same bit-to-symbol mapping for the I component of each of said 4 subsets and (2) this bit-to-symbol mapping comprises a given number of columns of a square grid in which the given number of columns is the maximum number of columns in a single one of the four subsets of the cross-grid of the selected one of said constellation sets of an odd power of 2 symbols;

said lookup table of said Q-channel RAM when preloaded by said fourth means in accordance with said selected one of said constellation sets being an odd power of 2 symbols (1) provides the same bit-to-symbol mapping for the Q component of each of said 4 subsets and (2) this bit-to-symbol mapping comprises a given number of rows of a square grid in which the given number of rows is the maximum number of rows in a single one of the four subsets of the cross-grid of the selected one of said constellation sets of an odd power of 2 symbols; and said trellis demapper further comprises (1) a remapper RAM responsive to said 2-bit input, said output of said I-channel RAM and said output of said Q-channel RAM being applied as respective inputs thereto for remapping the bit-to-symbol mapping of the square grid of symbols defined by both said I component present at the output of said I-channel RAM and said Q component present at the output of said Q-channel RAM into a square-grid bit-to-symbol mapping at the output of said remapper which remapper output square grid includes both those given symbol cells making up any one of said 4 subsets and at least one additional symbol cell located at least one corner of said remapper output square grid, the bits mapping said one additional symbol cell being a duplicate of the bits mapping a given symbol cell that is contiguously-located with respect to said one corner of said square grid; and (2) select means (a) responsive to said selected one of said constellation sets being an odd power of 2 symbols for forwarding said output of said remapper RAM as the output of said trellis demapper and (b) responsive to said selected one of said constellation sets being an even power of 2 symbols for directly forwarding said respective outputs of said I-channel RAM and said Q-channel RAM as the output of said trellis demapper.

5. The convolutional decoder defined in claim 4, wherein:

a certain constellation set of symbols exhibits an odd power of 2 number of symbols equal to 5;

the output from said I-channel RAM consists of 2 bits that are limited to expressing only 3 of 4 possible binary values in which these 3 binary values define the 3 columns of a 3×3 square grid;

the output from said Q-channel RAM consists of 2 bits that are limited to expressing only 3 of 4 possible binary values in which these 3 binary values define the 3 rows of said 3×3 square grid;

whereby there is derived a non-symmetrical 8-symbol subset situated within a 3×3 square-grid having a different bit-to-symbol mapping for each one of said 4 subsets at the output of said remapper, in which the duplicate bits map a single additional symbol cell for each separate one of said 4 subsets, and the single additional symbol cell is located at a different one of the 4 corners of the individual 3×3 square grids corresponding, respectively, to each separate one of said 4 subsets.

6. The convolutional decoder defined in claim 4, wherein:

a certain constellation set of symbols exhibits a given odd power of 2 number of symbols larger than 5, whereby the symbols of each of the four subsets of said certain constellation set of a given odd power of 2 number of symbols larger than 5 are arranged in a cross grid;

the output from said I-channel RAM consists of a group of at least 3 bits, wherein the number of binary values expressed by said group of bits is limited to expressing the number k of columns in the cross grid of any one 4 subsets, where k is a fourth positive integer;

the output from said Q-channel RAM consists of a group of at least 3 bits, wherein the number of binary values expressed by said group of bits is limited to expressing the number k of rows in the cross grid of any one 4 subsets;.

whereby there is derived a symmetrical cross-grid symbol subset situated within a k×k square-grid having the same bit-to-symbol mapping for each one of said 4 subsets at the output of said remapper, in which the duplicate bits map at least one additional symbol cell located at each of the 4 corners of the k×k square grid for each of said 4 subsets.

7. The convolutional decoder defined in claim 4, wherein:

said bit-to-symbol mapping appearing at each of the outputs of said of said I-channel RAM, said Q-channel RAM, and said remapper RAM consists of binary Gray-coded bits.

8. The convolutional decoder defined in claim 7, wherein:

said constellation sets of symbols in the I,Q plane that include a different even power of 2 number of symbols arranged in a square grid include a 16 symbol QAM constellation, a 64 symbol QAM constellation and a 256 symbol QAM constellation;

said constellation sets of symbols in the I,Q plane that include a different odd power of 2 number of symbols arranged in a cross grid include a 32 symbol QAM constellation and a 128 symbol QAM constellation;

the value of y is 3;

the value of z is 7; and the value of x is 6.

9. The convolutional decoder defined in claim 8, wherein:

said plurality of pragmatic trellis codes also comprise a distinct code for an 8-PSK constellation set of 8 symbols in the I,Q plane in which said 8 symbols are radially distributed symmetrically about the origin of said I,Q plane with each of said 8 symbols being angularly offset by substantially 22.5° with respect to an axis of said I,Q plane, and said 8-PSK constellation set of 8 symbols has a 3-bit bit-to-symbol mapping such that said 8-PSK constellation set is divided into 4 subsets of 2 symbols each in accordance with the binary value-expressed by the 2 least significant bits of said 3 bits, and the 2 symbols of each of these 4 subsets are differentiated from one another in accordance with the binary value expressed by the 1 highest significant bit of said 3 bits;

said trellis demapper further comprises an 8-PSK demapper logic means responsive to (1) said first x-bit input being applied as a first input thereto to define the value of said in-phase (I) digital input signal, (2) said second x-bit input being applied as a second input thereto to define the value of said quadrature (Q) digital input signal, and (3) said 2-bit input being applied as a third input thereto to select one of said 4 subsets of said 8-PSK constellation set in accordance with the binary value expressed by said 2-bit input being applied, and in response to said first, second and third inputs thereto said 8-PSK demapper logic means derives a 1-bit output therefrom that expresses the binary value of said 1 highest significant bit of said 3 bits of said bit-to-symbol mapping which is indicative of that one of the 2 symbols of said selected one of said 4 subsets of said 8-PSK constellation that is closest in (I+Q) distance to the position of a symbol in said I,Q plane defined by the respective values of the in-phase (I) digital input signal applied as a first input thereto and the quadrature (Q) digital input signal applied as a second input thereto; and said select means being also responsive to a selection of said 8-PSK constellation set forwarding said 1-bit output from said 8-PSK demapper logic means as the output of said trellis demapper.

10. The convolutional decoder defined in claim 9, wherein:

the bit-to-symbol mapping of the 8 symbols of the 8-PSK constellation set is such that a symbol in the first quadrant of the I,Q plane oriented at substantially 22.5° with respect to the I axis is mapped with the binary value 000, a symbol in the first quadrant of the I,Q plane oriented at substantially 22.5° with respect to the Q axis is mapped with the binary value 001, a symbol in the second quadrant of the I,Q plane oriented at substantially 22.5° with respect to the I axis is mapped with the binary value 010, a symbol in the second quadrant of the I,Q plane oriented at substantially 22.5° with respect to the Q axis is mapped with the binary value 011, a symbol in the third quadrant of the I,Q plane oriented at substantially 22.5° with respect to the I axis is mapped with the binary value 100, a symbol in the third quadrant of the I,Q plane oriented at substantially 22.5° with respect to the Q axis is mapped with the binary value 101, a symbol in the fourth quadrant of the I,Q plane oriented at substantially 22.5° with respect to the I axis is mapped with the binary value 110, and a symbol in the fourth quadrant of the I,Q plane oriented at substantially 22.5° with respect to the Q axis is mapped with the binary value 111; and said 8-PSK demapper logic means including means for deriving a binary value of "1" for said 1-bit output therefrom only if the product of the numerical value of said in-phase (I) digital input signal times the numerical value of $I_1$ is less than the product of the numerical value of said quadrature (Q) digital input signal times the numerical value of $Q_2$, where the numerical value of $I_1$ is 9 for subset 00, 4 for subset 01, −9 for subset 10 and −4 for subset 11, and the numerical value of $Q_2$ is −4 for subset 00, −9 for subset 01, −4 for subset 10 and −9 for subset 11.

11. The convolutional decoder defined in claim 10, wherein:

said convolutional decoder is a component of a multi-channel receiver.

12. The convolutional decoder defined in claim 11, wherein:

said multi-channel receiver is a digital television receiver for receiving forward-error-corrected compressed-digital television data transmitted thereto.

13. In a convolutional decoder of a plurality of pragmatic trellis codes each of which is defined by a series of convolutionally-encoded symbol packets applied as-in-phase (I) and quadrature-phase (Q) digital input signals thereto; wherein said plurality of pragmatic trellis codes comprise a distinct code for each constellation set of symbols in the I,Q plane that includes an odd power of 2 number of symbols arranged in a cross-grid bit-to-symbol mapping to produce cross-grid symbol constellations, with the largest of said cross-grid symbol constellations including $2^z$ symbols, where z is a first positive integer having a given value of at least 5; and wherein said convolutional decoder includes a trellis demapper for demapping each of said plurality of pragmatic trellis codes; the improvement wherein (1) the bit-to-symbol mapping of said cross grid of each constellation set is such that alternate cells of odd rows of said cross grid define a first subset of symbols, the remaining cells of odd rows of said cross grid define a second subset of symbols, alternate cells of even rows of said cross grid define a third subset of symbols, and the remaining cells of even rows of said cross grid define a fourth subset of symbols, and (2) said trellis demapper comprises:

an I-channel random access memory (RAM) having an effective depth of $2^{(x+2)}$ storage locations, where x is a second positive integer having a given value larger than one-half said first positive integer, each storage location having an effective width at least sufficient to store an entry of an I-defining lookup table of b-bits, where $b=z/2+\frac{1}{2}$;

a Q-channel RAM having an effective-depth of $2^{(x+2)}$ storage locations, each storage location having an effective width at least sufficient to store an entry of a Q-defining lookup table of b-bits;

first means for applying a first x-bit input to said I-channel RAM to define the value of said in-phase (I) digital input signal and for applying a second x-bit input to said Q-channel RAM to define the value of said quadrature (Q) digital input signal;

second means for applying a 2-bit input to both said I-channel RAM and said Q-channel RAM to define a selected one of said four subsets in accordance with the binary value of said applied 2-bit input;

third means for preloading said lookup table of said I-channel RAM in accordance with a selected one of said constellation sets of an odd power of 2 symbols such that the bits mapping the I component of that symbol of the selected one of said four subsets of said selected one of said constellation sets which is closest in value to the value defined by the in-phase (I) digital input signal to said I-channel RAM is read out as the output of said I-channel RAM to (1) provide the same bit-to-symbol mapping for the I component of each of said 4 subsets and (2) this bit-to-symbol mapping comprises a given number of columns of a square grid in which the given number of columns is the maximum number of columns in a single one of the four subsets of the cross-grid of the selected one of said constellation sets of an odd power of 2 symbols;

fourth means for preloading said lookup table of said Q-channel RAM in accordance with a selected one of said constellation sets of an odd power of 2 symbols such that the bits mapping the Q component of that symbol of the selected one of said four subsets of said selected one of said constellation sets which is closest in value to the value defined by the quadrature (Q) digital input signal to said Q-channel RAM is read out as the output of said Q-channel RAM to (1) provide the same bit-to-symbol mapping for the Q component of each of said 4 subsets and (2) this bit-to-symbol mapping comprises a given number of rows of a square grid in which the given number of rows is the maximum number of rows in a single one of the four subsets of the cross-grid of the selected one of said constellation sets of an odd power of 2 symbols; and a remapper RAM responsive to said 2-bit input, said output of said I-channel RAM and said output of said Q-channel RAM being applied as respective inputs thereto for remapping the bit-to-symbol mapping of the square grid of symbols defined by both said I component present at the output of said I-channel RAM and said Q component present at the output of said Q-channel RAM into a square-grid bit-to-symbol mapping at the output of said remapper which remapper output square grid includes both those given symbol cells making up any one of said 4 subsets and at least one additional symbol cell located at at least one corner of said remapper output square grid, the bits mapping said one additional symbol cell being a duplicate of the bits mapping a given symbol cell that is contiguously-located with respect to said one corner of said square grid.

14. The convolutional decoder defined in claim 13, wherein:

a certain constellation set of symbols exhibits an odd power of 2 number of symbols equal to 5;

the output from said I-channel RAM consists of 2 bits that are limited to expressing only 3 of 4 possible binary values in which these 3 binary values define the 3 columns of a 3×3 square grid;

the output from said Q-channel RAM consists of 2 bits that are limited to expressing only 3 of 4 possible binary values in which these 3 binary values define the 3 rows of said 3×3 square grid;

whereby there is derived a non-symmetrical 8-symbol subset situated within a 3×3 square-grid having a different bit-to-symbol mapping for each one of said 4 subsets at the output of said remapper, in which the duplicate bits map a single additional symbol cell for each separate one of said 4 subsets, and the single additional symbol cell is located at a different one of the 4 corners of the individual 3×3 square grids corresponding, respectively, to each separate one of said 4 subsets.

15. The convolutional decoder defined in claim 13, wherein:

a certain constellation set of symbols exhibits a given odd power of 2 number of symbols larger than 5, whereby the symbols of each of the four subsets of said certain constellation set of a given odd power of 2 number of symbols larger than 5 are arranged in a cross grid;

the output from said I-channel-RAM consists of a group of at least 3 bits, wherein the number of binary values expressed by said group of bits is limited to expressing the number k of columns in the cross grid of any one 4 subsets, where k is a fourth positive integer;

the output from said Q-channel RAM consists of a group of at least 3 bits, wherein the number of binary values expressed by said group of bits is limited to expressing the number k of rows in the cross grid of any one 4 subsets;

whereby there is derived a symmetrical cross-grid symbol subset situated within a k×k square-grid having the same bit-to-symbol mapping for each one of said 4 subsets at the output of said remapper, in which the duplicate bits map at least one additional symbol cell located at each of the 4 corners of the k×k square grid for each of said 4 subsets.

16. The convolutional decoder defined in claim 13, wherein:

said-bit-to-symbol mapping appearing at each of the outputs of said of said I-channel RAM, said Q-channel RAM, and said remapper RAM consists of binary Gray-coded bits.

17. The convolutional decoder defined in claim 16, wherein:

said constellation sets of symbols in the I,Q plane that include a different odd power of 2 number of symbols arranged in a cross grid include a 32 symbol QAM constellation and a 128 symbol QAM constellation;

the value of z is 7; and the value of x is 6.

18. The convolutional decoder defined in claim 17, wherein:

said plurality of pragmatic trellis codes also comprise a distinct code for an 8-PSK constellation set of 8 symbols in the I,Q plane in which said 8 symbols are radially distributed symmetrically about the origin of said I,Q plane with each of said 8 symbols being angularly offset by substantially 22.5° with respect to an axis of said I,Q plane, and said 8-PSK constellation set of 8 symbols has a 3-bit bit-to-symbol mapping such that said 8-PSK constellation set is divided into 4 subsets of 2 symbols each in accordance with the binary value expressed by the 2 least significant bits of said 3 bits, and the 2 symbols of each of these 4 subsets are differentiated from one another in accordance with the binary value expressed by the 1 highest significant bit of said 3 bits;

said trellis demapper further comprises an 8-PSK demapper logic means responsive to (1) said first x-bit input being applied as a first input thereto to define the value of said in-phase (I) digital input signal, (2) said second x-bit input being applied as a second input thereto to define the value of said quadrature (Q) digital input signal, and (3) said 2-bit input being applied as a third input thereto to select one of said 4 subsets of said 8-PSK constellation set in accordance with the binary value expressed by said 2-bit input being applied, and in response to said first, second and third inputs thereto said 8-PSK demapper logic means derives a 1-bit output therefrom that expresses the binary value of said 1 highest significant bit of said 3 bits of said bit-to-symbol mapping which is indicative of that one of the 2 symbols of said selected one of said 4 subsets of said 8-PSK constellation that is closest in (I+Q) distance to the position of a symbol in said I,Q plane defined by the respective values of the in-phase (I) digital input signal applied as a first input thereto and the quadrature (Q) digital input signal applied as a second input thereto; and select means (a) responsive to said selected one of said constellation sets being an odd power of 2 symbols for forwarding said output of said remapper RAM as the output of said trellis demapper and (b) responsive to a selection of said 8-PSK constellation set forwarding said 1-bit output from said 8-PSK demapper logic means as the output of said trellis demapper.

19. The convolutional decoder defined in claim 18, wherein:

the bit-to-symbol mapping of the 8 symbols of the 8-PSK constellation set is such that a symbol in the first quadrant of the I,Q plane oriented at substantially 22.5° with respect to the I axis is mapped with the binary value 000, a symbol in the first quadrant of the I,Q plane oriented at substantially 22.5° with respect to the Q axis is mapped with the binary value 001, a symbol in the second quadrant of the I,Q plane oriented at substantially 22.5° with respect to the I axis is mapped with the binary value 010, a symbol in the second quadrant of the I,Q plane oriented at substantially 22.5° with respect to the Q axis is mapped with the binary value 011, a symbol in the third quadrant of the I,Q plane oriented at substantially 22.5° with respect to the I axis is mapped with the binary value 100, a symbol in the third quadrant of the I,Q plane oriented at substantially 22.5° with respect to the Q axis is mapped with the binary value 101, a symbol in the fourth quadrant of the I,Q plane oriented at substantially 22.5° with respect to the I axis is mapped with the binary value 110, and a symbol in the fourth quadrant of the I,Q plane oriented at substantially 22.5° with respect to the Q axis is mapped with the binary value 111; and said 8-PSK demapper logic means including means for deriving a binary value of "1" for said 1-bit output therefrom only if the product of the numerical value of said in-phase (I) digital input signal times the numerical value of $I_1$ is less than the product of the numerical value of said quadrature (Q) digital input signal times the numerical value of $Q_2$, where the numerical value of $I_1$ is 9 for subset 00, 4 for subset 01, −9 for subset 10 and −4 for subset 11, and the numerical value of Q2 is −4 for subset 00, −9 for subset 01, −4 for subset 10 and −9 for subset 11.

* * * * *